United States Patent
Zhu

(10) Patent No.: US 8,044,740 B2
(45) Date of Patent: Oct. 25, 2011

(54) TEMPERATURE COMPENSATED RC OSCILLATOR FOR SIGNAL CONDITIONING ASIC USING SOURCE BULK VOLTAGE OF MOSFET

(75) Inventor: Zhineng Zhu, Fremont, CA (US)

(73) Assignee: S3C, Inc., Sunnyvale, CA (US)

( * ) Notice: Subject to any disclaimer, the term of this patent is extended or adjusted under 35 U.S.C. 154(b) by 99 days.

(21) Appl. No.: 12/553,931

(22) Filed: Sep. 3, 2009

(65) Prior Publication Data
US 2011/0050353 A1    Mar. 3, 2011

(51) Int. Cl.
*H03L 1/02* (2006.01)
*H03K 3/353* (2006.01)
(52) U.S. Cl. .......................... 331/176; 331/111; 331/143
(58) Field of Classification Search .................. 331/111, 331/143, 175, 176
See application file for complete search history.

(56) References Cited

U.S. PATENT DOCUMENTS

| | | | |
|---|---|---|---|
| 5,870,345 A | 2/1999 | Stecker | |
| 6,091,286 A | 7/2000 | Blauschild | |
| 6,377,130 B1 | 4/2002 | Haman | |
| 2005/0134393 A1 | 6/2005 | Kim et al. | |
| 2007/0233912 A1 | 10/2007 | Piasecki et al. | |
| 2007/0241833 A1 | 10/2007 | Nervegna | |
| 2009/0002084 A1* | 1/2009 | Inoue et al. | 331/108 A |
| 2009/0153214 A1 | 6/2009 | Takatori | |

FOREIGN PATENT DOCUMENTS

JP    55115717 A  *  9/1980

* cited by examiner

*Primary Examiner* — Ryan Johnson
(74) *Attorney, Agent, or Firm* — Sawyer Law Group, P.C.

(57) ABSTRACT

A temperature compensated CMOS RC oscillator circuit changes the source-bulk voltage to stabilize the MOSFET's threshold voltage variation over temperature using a resistor and temperature-correlated bias current. The MOSFET's source is connected to ground through a resistor. This temperature-correlated bias current also runs through this resistor. When temperature increases, the bias current also increases, which increases the MOSFET's source-bulk voltage. The increased source-bulk voltage helps to stabilize the threshold voltage of MOSFET at high temperature. A power saving logic is also embedded in this oscillator to achieve higher frequency at lower power consumption. In the present invention, there is no high gain op amp or high speed comparator, which makes the resultant oscillator to be low power design and which can be integrated into a single chip with other system.

7 Claims, 27 Drawing Sheets

US 8,044,740 B2

TEMPERATURE COMPENSATED RC OSCILLATOR FOR SIGNAL CONDITIONING ASIC USING SOURCE BULK VOLTAGE OF MOSFET

FIELD OF THE INVENTION

The present invention relates to an RC oscillator and, more particularly, to a temperature-stabilized oscillator with minimal hardware and low power consumption.

BACKGROUND OF THE INVENTION

An accurate clock generator is very important for signal-conditioning in a variety of applications. An application specific integrated circuit (ASIC) operating that utilizes such a generator in an environment is subject to substantial variations in temperature. One example of such an environment is an automotive application, in which the temperature range could be from −50 C to 150 C. An unstable clock frequency reduces the performance of the internal circuits, especially the switched-cap circuits, baud rate generator and handshake circuits.

To provide a stable reference clock, many oscillator circuits have been studied. A common one is the crystal oscillator, an example of which is disclosed, for example in U.S. Pat. No. 6,377,130. However, a crystal cannot be integrated into a single chip and its usage is limited by its size.

RC oscillators have been studied for a long time. Conventional RC oscillators are limited to low-frequency, low-precision applications sources such as tone generators, alarms or flashing indicators. Also, the temperature coefficient (TC) parameters of those resistors and capacitors are hard to control.

Many other RC circuits, like canonic RC-active frequency oscillator, require an operational amplifier as disclosed, for example in U.S. Pat. No. 5,870,345 or a comparator as disclosed in US Patent Publication No. 2005/0134393, to stabilize the oscillating frequency. To provide whether to build a high gain operational amplifier or a high speed comparator is complicated and expensive in the hardware and power consumption. This is particularly true if the frequency of the application is up to megahertz range. Also the offset voltage of the operational amplifier and comparator is temperature dependent, which gives a temperature dependent clock signal. To correct this offset, a complicated circuitry is required.

Due to the aforementioned drawbacks, conventional approaches cannot provide a stabilized oscillator circuit integrated into ASIC with a high performance. Therefore a new approach is necessary. The present invention addresses such a need.

SUMMARY OF THE INVENTION

A temperature compensated CMOS RC oscillator circuit changes the source-bulk voltage to stabilize the MOSFET's threshold voltage variation over temperature using a resistor and temperature-correlated bias current. The MOSFET's source is connected to ground through a resistor. This temperature-correlated bias current also runs through this resistor. When temperature increases, the bias current also increases, which increases the MOSFET's source-bulk voltage. The increased source-bulk voltage helps to stabilize the threshold voltage of MOSFET at high temperature. A power saving logic is also embedded in this oscillator to achieve higher frequency at lower power consumption. In the present invention, there is no high gain op amp or high speed comparator, which makes the resultant oscillator to be low power design and which can be integrated into a single chip with other system.

DETAILED DESCRIPTION

The present invention relates to an RC oscillator and, more particularly, to a temperature-stabilized oscillator with minimal hardware and low power consumption. The following description is presented to enable one having ordinary skill in the art to make and use the invention and is provided in the context of a patent application and the generic principles and features described herein will be apparent to those skilled in the art. Thus, the present invention is not intended to be limited to the embodiments shown, but is to be accorded the widest scope consistent with the principles and features described herein.

The present invention describes an on-chip oscillator using a very small amount of hardware. An adaptive method is used to overcome the MOSFET's threshold voltage change over temperature, therefore resulting in a temperature-stabilized oscillator. Also the power saving scheme is included which can attain higher clock frequency at lower power consumption.

For some signal-conditioning chips, an on-chip oscillator is preferred to provide a highly integrated circuit. But some on-chip oscillators have variable frequency over temperature. This variable frequency will change the performance of some internal circuits, like switch-cap circuit. Also, it makes the timing unpredictable and baud rate undetermined for some communication signals. To generate a stable clock, an oscillator often needs expensive blocks, like a comparator or an operational amplifier, which consumes large amount of area and power if the oscillator needs to work at MHz range. A system and method in accordance with invention describes a low power oscillator economic in hardware while showing a stabilized frequency over temperature.

Figure 1A:
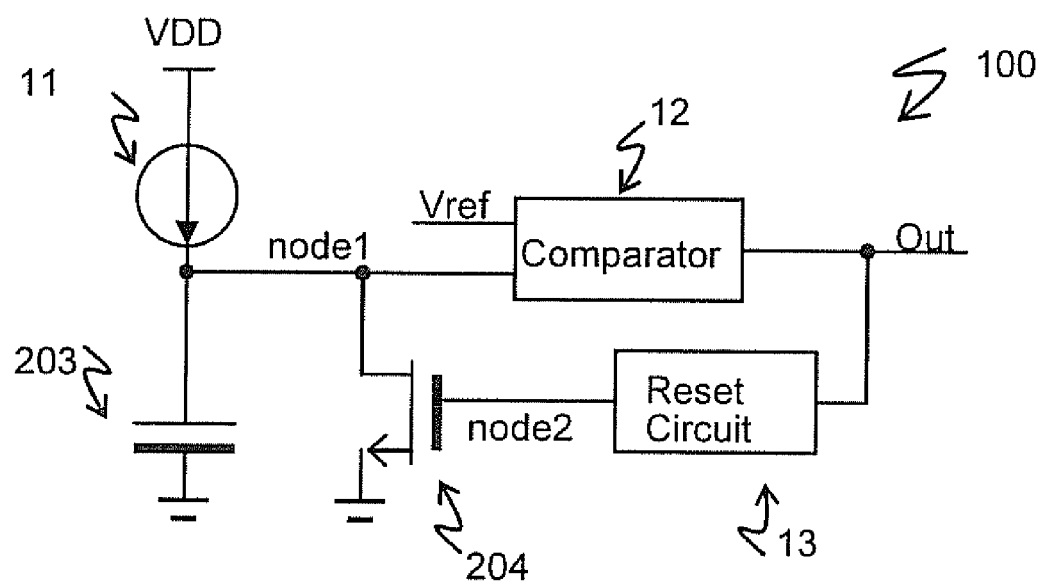
FIG. 1A shows the block diagram of a typical RC oscillator.
Figure 1B:
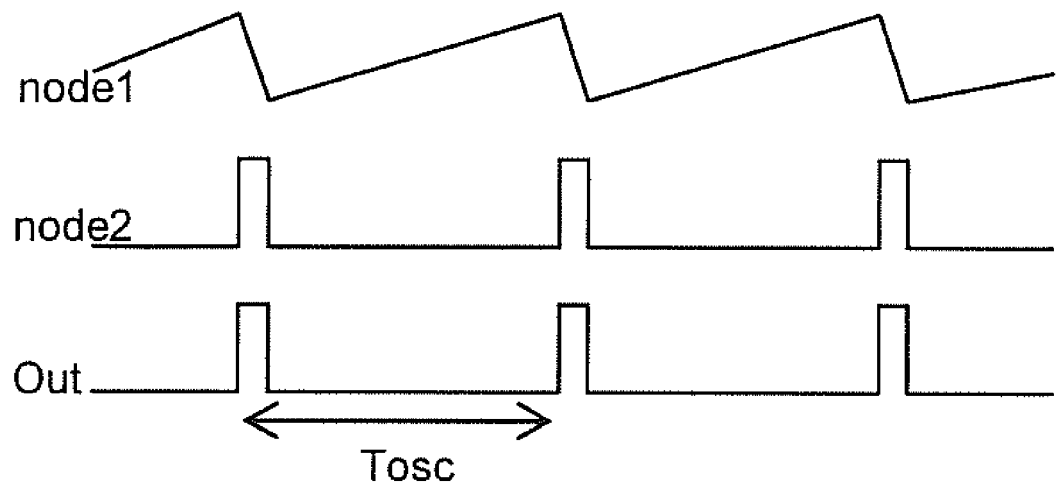
FIG. 1B illustrates the waveform of each node of FIG. 1A.

FIG. 1A shows the block diagram of a typical RC oscillator. Block 11 is a current source, block 12 is a comparing circuit and block 13 is a reset circuit, which turns on/off NMOS device 204; and device 203 is a capacitor. The waveform of each node is given in FIG. 1B. Assuming NMOS 204 is off at certain time point and node 1's voltage is zero, the current source 11 charges capacitor 203 and the voltage at node 1 increases linearly. NMOS 204 is kept in the off state and voltages at 'Out' and node 2 keeps low until at a time point that node 1 voltage becomes higher than the reference voltage Vref. At this point comparing circuit 12 generates logic high. This logic high triggers the reset circuit 13 to turn on NMOS 204. When NMOS 204 is on, the capacitor 203 is discharged quickly and voltage at node 1 drops to a voltage far less than Vref. When node 1 is less than Vref, the comparing circuit 12 changes state, and the reset circuit 13 turns off NMOS 204 again and current source 11 recharges capacitor 203. This process repeats continuously.

As mentioned before, the comparing circuit 12 in FIG. 1A is typically implemented as a dedicated operational amplifier or a comparator. These types of circuits are expensive in hardware and are high in power consumption.

Figure 2:
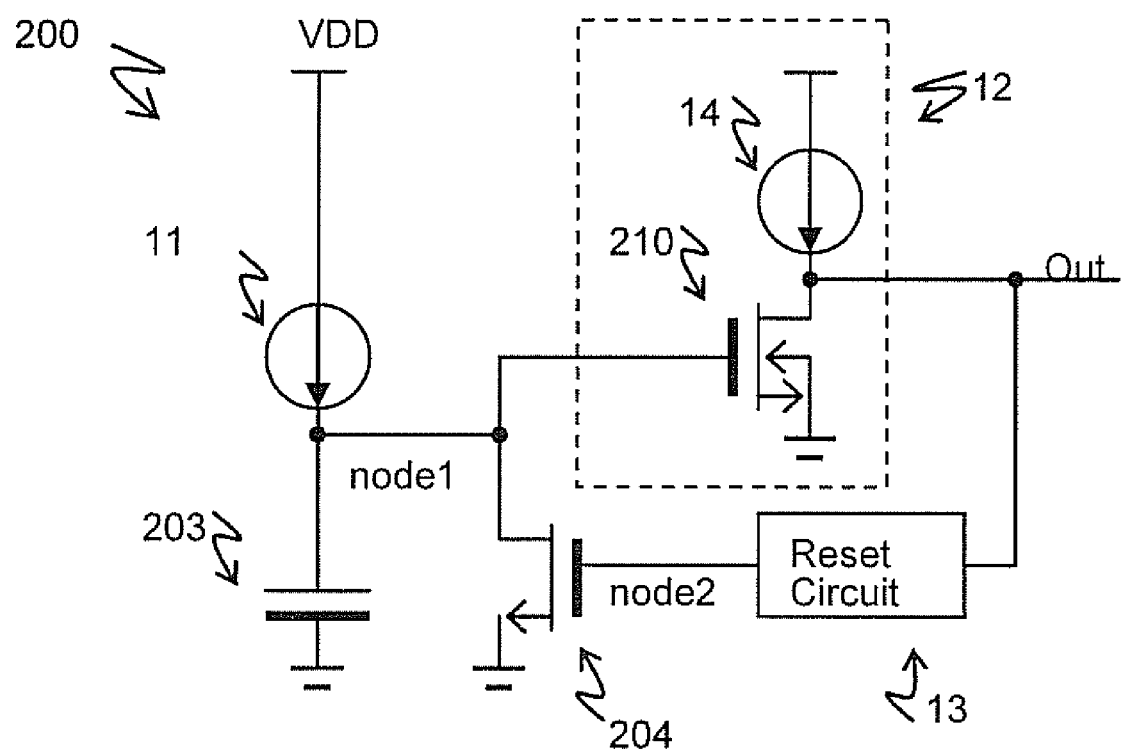
FIG. 2 illustrates an oscillator circuit which utilizes a simplified comparing circuit.

FIG. 2 illustrates an oscillator circuit which utilizes a simplified comparing circuit. Instead of using complex comparator or operational amplifier circuit for block 12 in FIG. 1A, the comparing circuit in FIG. 2 is implemented using only an NMOS device 210 and a current source 14, therefore resulting into less hardware and lower power consumption. The reference voltage Vref mentioned in FIG. 1A is threshold voltage of NMOS 210 in FIG. 2.

In this structure, the parameter with the biggest variation over the temperature is NMOS 210's threshold voltage. It directly changes the output clock frequency over the temperature. If the source and bulk of NMOS 210 are directly connected to the ground, the threshold voltage of NMOS 210 will be decreased when temperature rises and NMOS 210's switching point will be at a lower value, which results into a clock signal with a higher frequency. While at a lower temperature, the threshold voltage of NMOS 210 is increased and the switching point is higher. It will take longer time for the current source 11 to charge capacitor 203, which results into a clock signal with lower frequency. To overcome this temperature variation and also keep the power consumption as low as possible, the threshold voltage of NMOS device 210 in FIG. 2 should be stabilized over temperature.

Stabilization of MOSFET Threshold Voltage:

It is well known that MOSFET's threshold voltage is proportional to the square root of its source-bulk voltage given by the following equation:

$$V_{TH}=V_{TH0}+\gamma(\sqrt{|2\Phi_F+V_{SB}|}-\sqrt{|2\Phi_F|}) \quad (1)$$

Where, $V_{TH0}$ is MOSFET's threshold voltage with $V_{SB}=0$, $\Phi_F$ is Fermi level, $V_{SB}$ is the voltage between MOSFET's source and bulk.

Keeping source-bulk voltage fixed, likely connecting both source and bulk of MOSFET to ground, the second term of equation (1) is equal to 0. And the threshold voltage $V_{TH0}$ is reverse proportional to temperature. If the source-bulk voltage of MOSFET is designed to be non-zero value, rising with increased temperature, the threshold voltage could be stabilized to some extent. That is the main idea of this invention.

Figure 3:
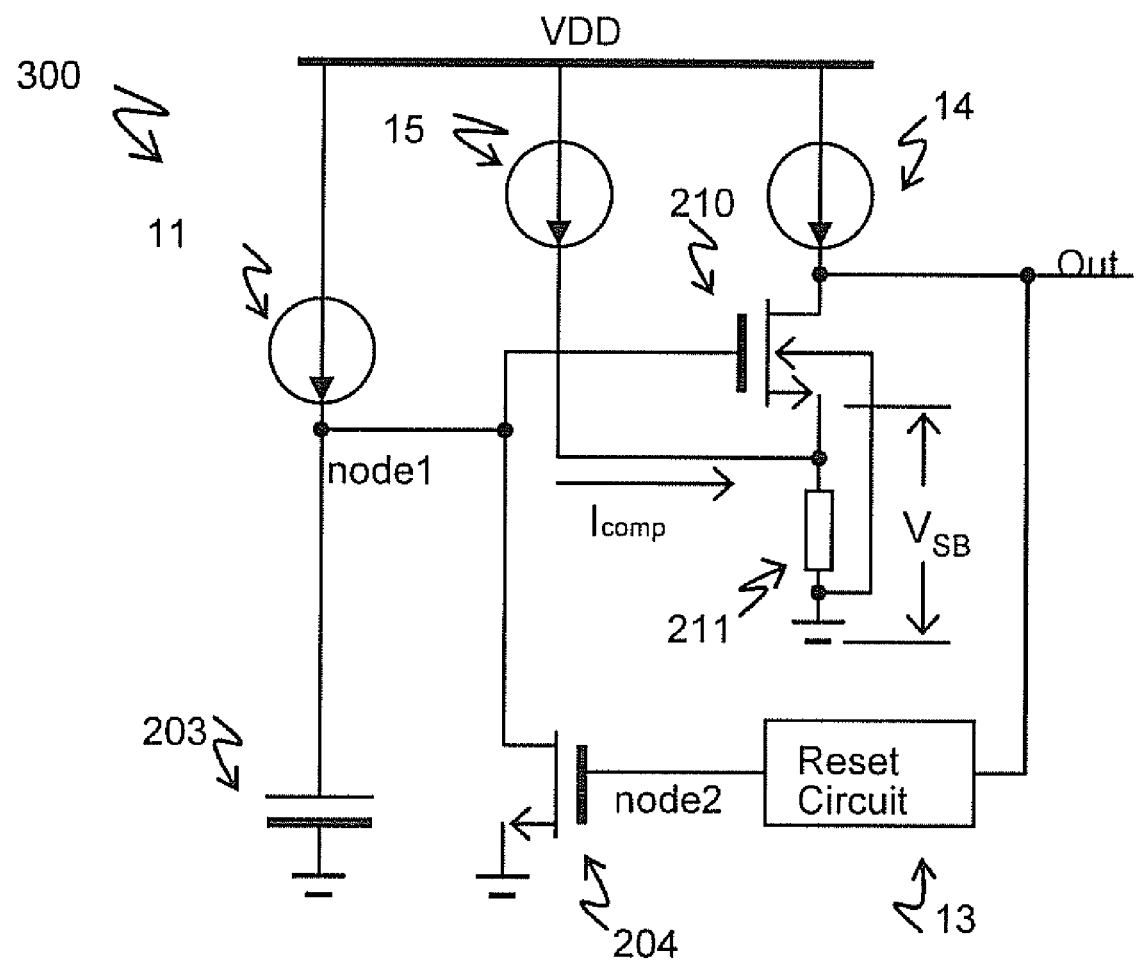
FIG. 3 shows one way of changing source-bulk voltage by inserting a resistor between source and bulk of NMOS while NMOS's bulk is directly connected to ground.

To counteract such a threshold voltage change of NMOS 210 in FIG. 2 over the temperature, FIG. 3 shows one way of changing source-bulk voltage by inserting a resistor 211 between source and bulk of NMOS 210 while NMOS 210's bulk is directly connected to ground. One extra current source 15 injects compensation current into resistor 211. Current source 15 generates a current $I_{comp}$ with positive temperature coefficient, that is, the source 15 generates a bigger current and source-bulk voltage $V_{SB}$ at a higher temperature.

$$V_{SB}=I_{comp}*R \quad (2)$$

In equation (1), $V_{TH0}$ has a negative linear relationship with temperature. If $V_{SB}$ is designed to be proportional to $T^2$, where T is the temperature value, there will be an item proportional to T in equation (1) to overcome $V_{TH0}$ change over temperature, and therefore the $V_{TH}$ variation over temperature is stabilized. If the resistor in FIG. 3 is implemented by a poly resistor, which has a very small temperature coefficient, the compensation current $I_{comp}$ should be designed to be positively proportional to $T^2$.

Figure 4A:
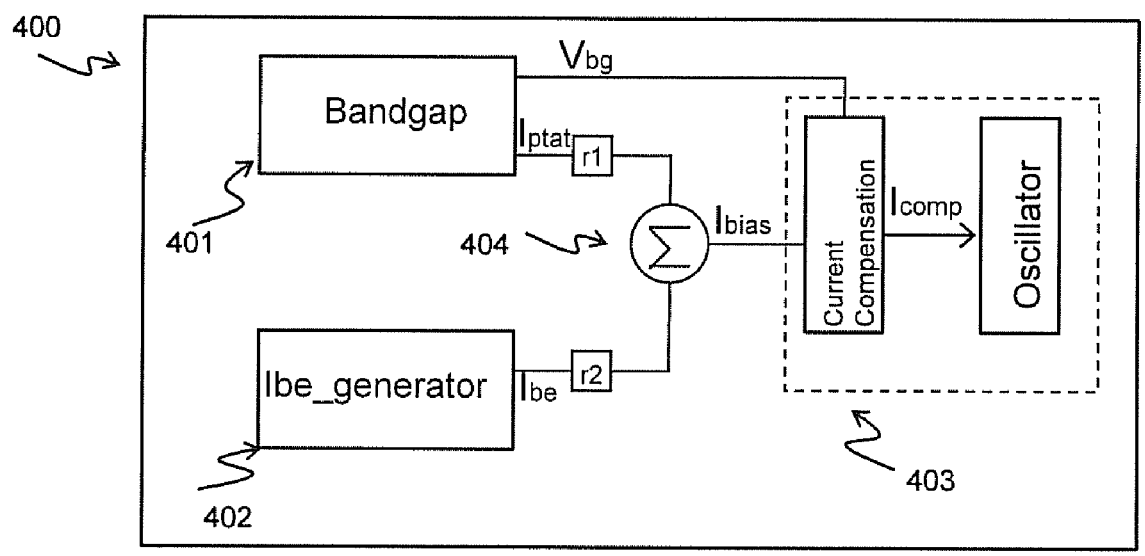
FIG. 4A shows a block diagram that can generate reference current $I_{bias}$ and reference voltage.
Figure 4B:
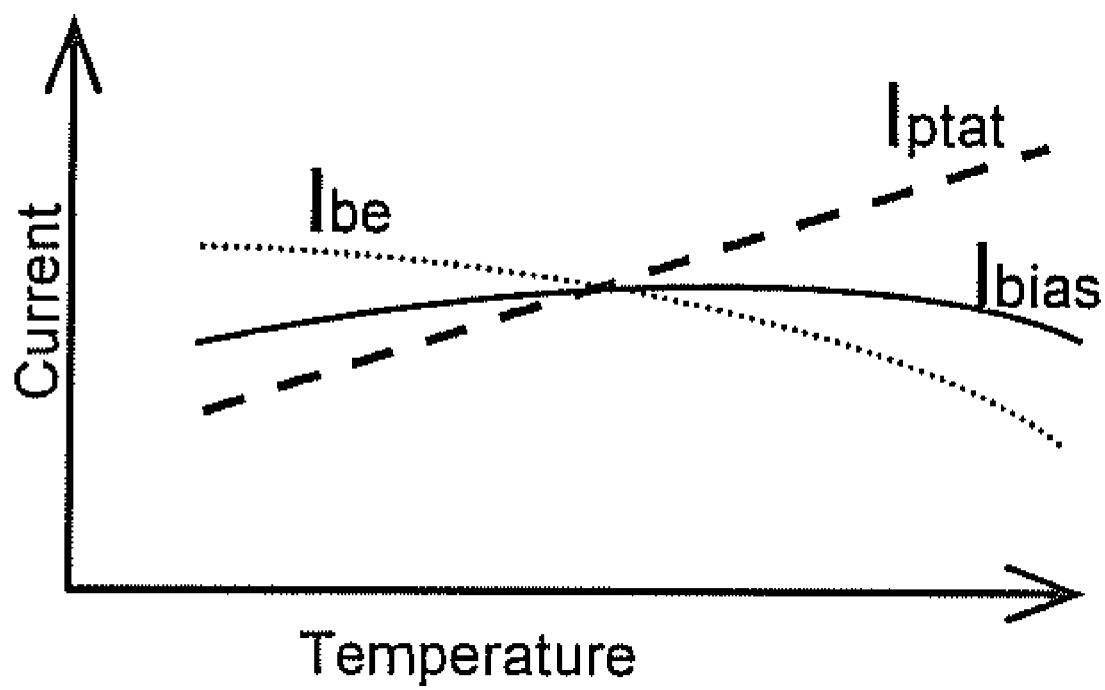
FIG. 4B shows the temperature slope of $I_{be}$, $I_{ptat}$ and their combination $I_{bias}$.

Before generating the compensation current $I_{comp}$, two assumptions are made here: first, the ASIC itself can generate a reference bias current ($I_{bias}$) constant over temperature to the first order; and the second assumption is that ASIC itself can generate a reference voltage constant over temperature to the first order, like $V_{bg}$ generated by a bandgap circuit. These two assumptions are easyly met for a signal-conditioning ASIC. FIG. 4(a) shows a block diagram that can generate the reference current $I_{bias}$ and reference voltage. The diagram includes $I_{ptat}$ and $V_{bg}$ generator 401, $I_{be}$ generator 402, the oscillator 403 and $I_{bias}$ generator 404. $I_{ptat}$ is a PTAT current with a positive temperature coefficient. $I_{be}$ is a $V_b$-referenced current and therefore has a negative temperature coefficient. The block r1 and r2 are weight of $I_{ptat}$ and $I_{be}$ respectively. FIG. 4B shows the temperature slope of $I_{be}$, $I_{ptat}$ and their combination $I_{bias}$. With proper selection if r1 and r2, the slope of $I_{bias}$ over temperature can be close to zero.

Figure 5:
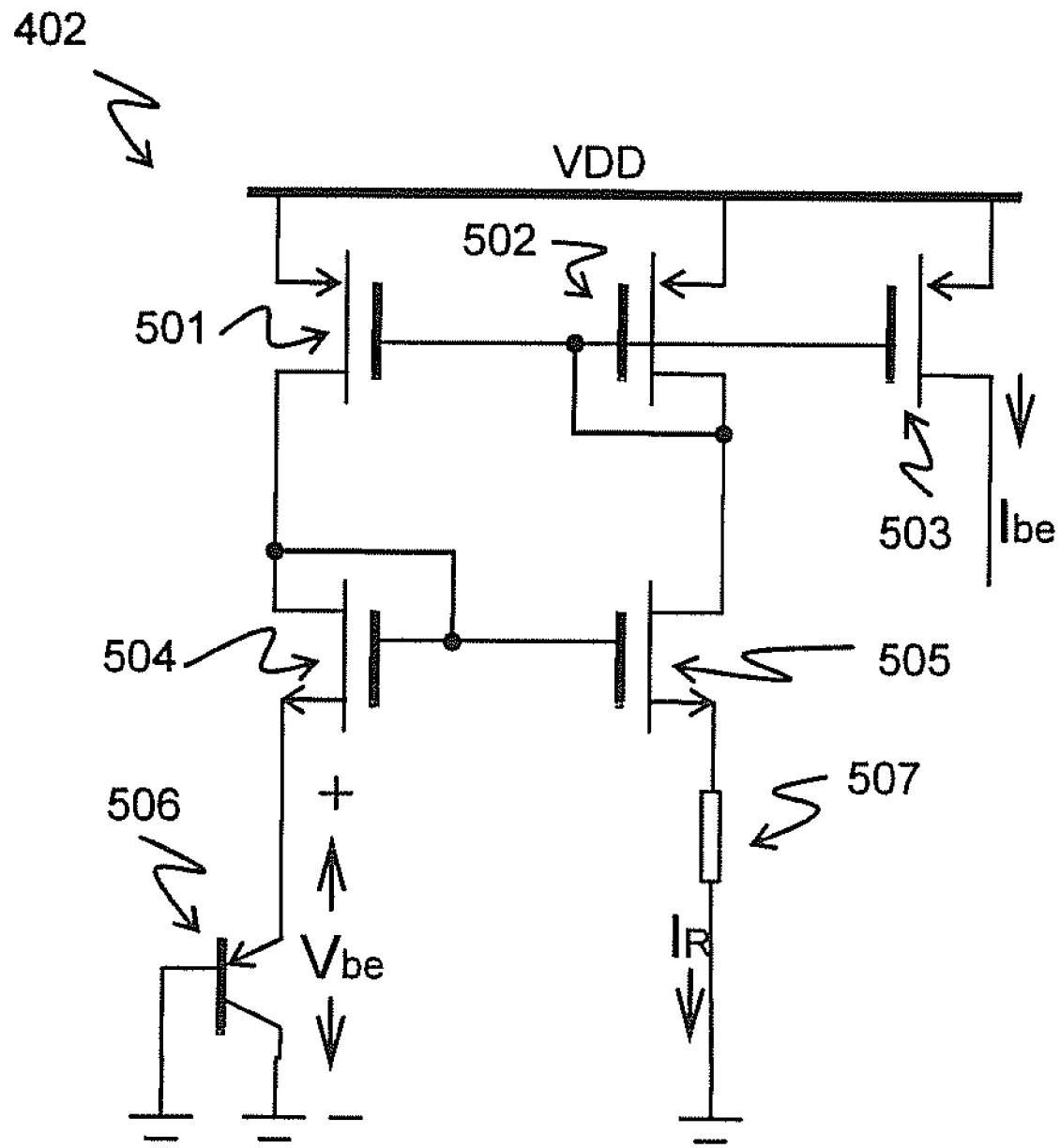
FIG. 5 shows a prior art implementation of $I_{be}$ generator 402 in FIG. 4A.

FIG. 5 shows an implementation of $I_{be}$ generator 402 in FIG. 4A. The source of PMOS 501 is connected to VDD. Its gate is connected to PMOS 502. PMOS 502's source is connected to VDD and its drain is diode-connected to its own gate. The drain of NMOS 504 is connected to both its own gate and the drain of PMOS 501. The gate of NMOS 504 is again connected to the gate of NMOS 505. NMOS 505's drain is connected to the drain of PMOS 502. The source of NMOS 505 is connected to a resistor 507.

The other end of resistor 507 is connected to ground. The source of NMOS 504 is connected to the emitter of a PNP transistor 506, and the base and connecter terminals of PNP transistor 506 are both connected to ground. The feedback circuit formed by PMOS 501, PMOS 502, NMOS 504 and NMOS 505 forces the current in PNP transistor 506 to be the same as that in resistor 507.

Assuming matched devices between NMOS 504 and NMOS 505, the gate-source voltage of NMOS 504 is equal to that of NMOS 505, and thus the current $I_R$ equals $V_{be}/R$, where R is the resistance value of resistor 507 and $I_R$ is the current running through resistor 507, Resistor 507 is implemented with material having very small temperature coefficient, like poly resistor in a standard CMOS process. The source of PMOS 503 is connected to VDD and its gate is connected to the gate of PMOS 502 and PMOS 501. Its drain is the output of $I_{be}$, a mirror of current $I_R$. Since $V_{be}$ has a negative temperature coefficient, $I_R$ and $I_{be}$ also have a negative coefficient.

Figure 6:
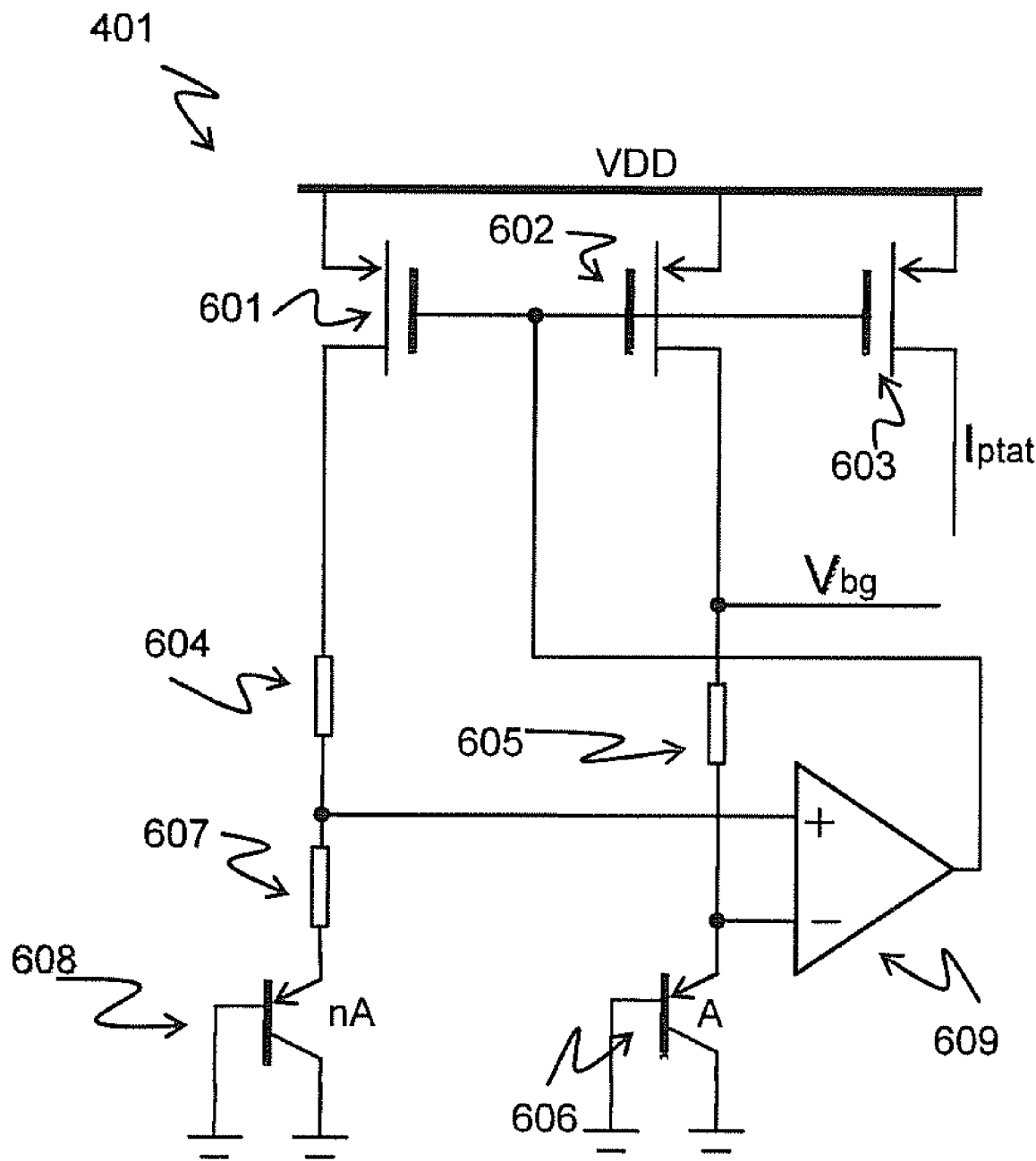
FIG. 6 shows a prior art implementation of a block in FIG. 4A, which includes generators $I_{ptat}$ and $V_{bg}$.

FIG. 6 shows an implementation of block 401 in FIG. 4A, which includes generators $I_{ptat}$ and $V_{bg}$. The source of PMOS 601 is connected to VDD and its gate is connected to the gate of PMOS 602. The source of PMOS 602 is connected to VDD. The drain of PMOS 601 is connected to a resistor 604. The other end of resistor 604 is connected to resistor 607. The other end of resistor 607 is connected to the emitter of PNP transistor 608. The base and connector of PNP transistor 608 are both connected to ground. The drain of PMOS 602 is connected to a resistor 605. The other end of resistor 605 is connected to the emitter of a PNP transistor 606.

The base and connector terminal of PNP transistor 606 are both connected to ground. Block 609 is an op amp. Its positive input is connected to both resistor 604 and resistor 607. 609's negative input is connected to the emitter of PNP transistor 606. Op amp 609's output is connected to the gates of PMOS 601 and PMOS 602. Here the emitter area of PNP transistor 608 is n times of that of PNP transistor 606. The feedback loop forces transistor PNP transistor 608 and PNP transistor 606 to operate at the same bias current.

As a result, the difference between the PNP transistor 608's and PNP transistor 606's base-emitter voltages must appear across the resistor 607, and thus, $I_{R607}=VT^* \ln(n)/R607$, where $I_{R607}$ is the current in resistor 607 and R607 is the resistance value of resistor 607. VT is the thermal voltage. The source of PMOS 603 is connected to VDD and its gate is connected to gate of PMOS 601 and PMOS 602. POMS 603's drain is the output current $I_{ptat}$. The drain of PMOS 602 is the $V_{bg}$ output.

$I_{be}$ has a negative slope and $I_{ptat}$ has a positive slope. These two currents are summed together to generate a bias current $I_{bias}$ as shown in FIG. 4B. The temperature slope of $I_{bias}$ could be any value between that of $I_{be}$ and $I_{ptat}$. By careful sizing of PMOS 503 in FIG. 5 and PMOS 603 in FIG. 6, $I_{bias}$ can get a close-to-zero first order temperature coefficient.

Figure 7:
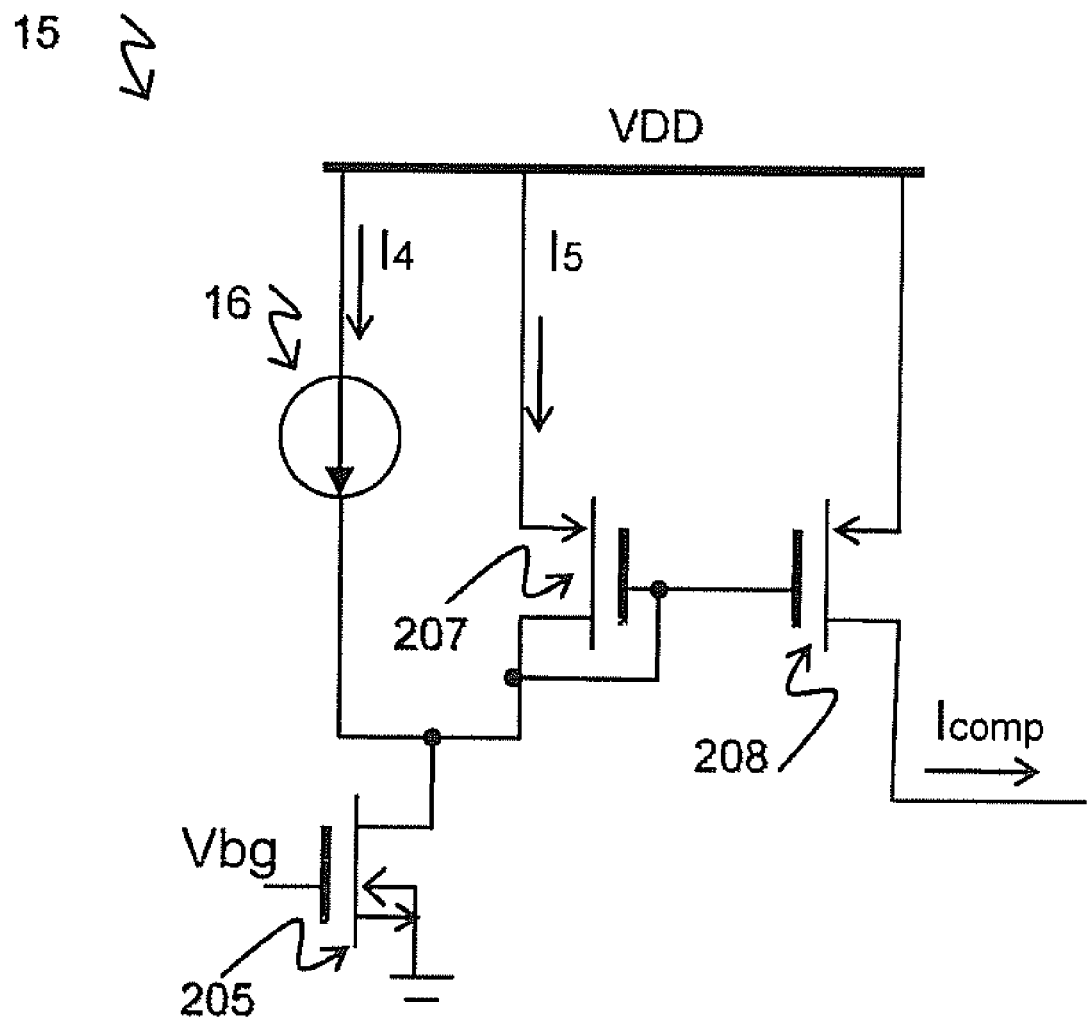
FIG. 7 shows one embodiment of the current source of FIG. 3.

Based on the above two assumptions, the following FIG. 7 shows one embodiment of current source 15 in FIG. 3, which generates a compensation current $I_{comp}$ proportional to $T^2$.

$V_{bg}$ in FIG. 7 are generated in a way shown in FIG. 4A. The current source 16 is a ratio of $I_{bias}$ shown in FIG. 4A with close-to-zero temperature coefficient. The drain current of NMOS 205 is controlled by the following equation:

$$I_D = \frac{1}{2}u_n C_{OX} \frac{W}{L}(V_{GS} - V_{TH0})^2 \propto T^2 \quad (3)$$

Where $u_n$ is electron's mobility, $C_{OX}$ is gate oxide capacitance, W and L are MOSFET's width and length respectively. $V_{GS}$ is the voltage between MOSFET's gate and source terminals, which is equal to $V_{bg}$ or part of $V_{bg}$.

As mentioned above, the voltage $V_{bg}$ in FIG. 7 is constant when compared to the variation of NMOS 205's threshold voltage over temperature. So, if the temperature rises, the threshold voltage of NMOS 205 decreases, and the overdriven voltage of NMOS 205 rises as well because $V_{bg}$ is constant. Increased overdriven voltage of NMOS 205 will increase the bias current in NMOS 205, while current $I_4$ in current source 16 is constant to some extent. That means the amount of increased bias current at higher temperature comes from $I_5$ in PMOS 207. This increased bias current $I_5$ in PMOS 207 is mirrored into compensation current $I_{comp}$ in PMOS 208. $I_{comp}$ in PMOS 208 is injected into the resistor 211 in FIG. 3, therefore increasing the source-bulk voltage of NMOS 210 through resistor 211 in FIG. 3. This increased source-bulk voltage compensates NMOS 210's threshold voltage decreasing over the temperature variation. On the other side, if the temperature decreases, the overdrive voltage of NMOS 205 decreases, the bias current in NMOS 205 and compensation current $I_{comp}$ decrease as well. This will decrease the source-bulk voltage of NMOS 210 in FIG. 3 and finally stabilizes the threshold voltage of NMOS 210. Because of drain current $I_D$ in NMOS 205 is proportional to $T^2$, the same is true for $I_{comp}$.

Embodiment of Present Invention

Figure 8:
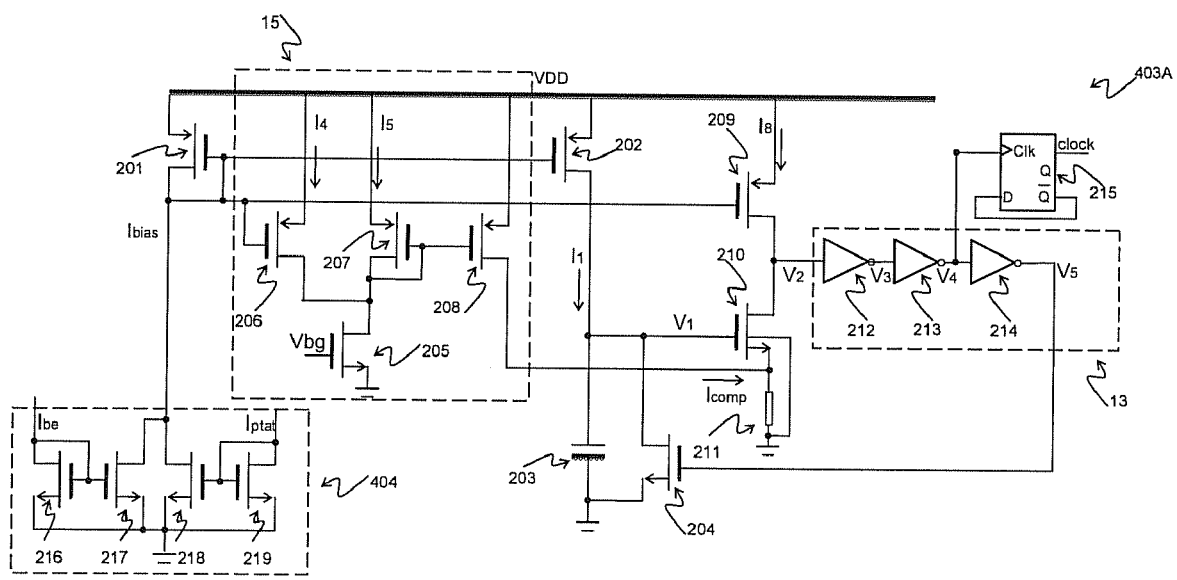
FIG. 8 illustrates an embodiment of a circuit in accordance with the present invention.

FIG. 8 illustrates an embodiment of a circuit in accordance with the present invention. In FIG. 8, the source of PMOS 201 is connected to VDD, and its gate is connected to its own drain terminal. PMOS 201's drain is bias current $I_{bias}$, which is a combination of $I_{be}$ and $I_{ptat}$ and is constant to the first order. The source of NMOS 216 is connected to the ground and its drain and gate are diode connected to $I_{be}$ generated in FIG. 5. The gate of NMOS 217 is connected to the gate of NMOS 216. NMOS 217's source is connected ground. NMOS 216 and 217 mirror $I_{be}$ current into PMOS 201. The source of NMOS 218 is connected to ground and its drain and gate are diode connected to $I_{ptat}$ generated in FIG. 6. The gate of NMOS 219 is connected to the gate of NMOS 218. NMOS 219's source is connected ground. NMOS 218 and 219 mirror $I_{ptat}$ current into PMOS 201. The NMOS 216, 217, 218 and 219 consist of current summation circuit 404 in FIG. 4A.

The source of PMOS 202 is connected to VDD and its gate is connected to the gate of PMOS 201, and therefore PMOS 201 and PMOS 202 comprise of the current source of 11 in FIG. 3. PMOS 202's drain current is I1 and ideally I1 in PMOS 202 is a ratio of $I_{bias}$ in PMOS 201. The drain of PMOS 202 is connected to one end of a capacitor 203. The other end of capacitor 203 is connected to ground. So, the current I1 is to charge capacitor 203. The source of PMOS 206 is connected to VDD and its gate is connected to the gate of PMOS 201. Bias current I4 in PMOS 206 is a ratio of current $I_{bias}$ in PMOS 201. PMOS 201 and PMOS 206 are implementation of current source 16 in FIG. 7. The drain of PMOS 206 is connected to the drain of NMOS 205. The gate voltage of NMOS 205 is $V_{bg}$ or fraction of $V_{bg}$ provided by the circuit shown in FIG. 6.

The source of NMOS 205 is connected to ground and its drain is again connected to the drain of PMOS 207. The source of PMOS 207 is connected to VDD and its gate is diode-connected to its own drain. The gate of PMOS 207 is again connected to the gate of PMOS 208. The source of PMOS 208 is connected to VDD. Therefore PMOS 207 and PMOS 208 comprise a current mirror. PMOS 201, PMOS 202, and PMOS 205, PMOS 206, PMOS 207 and PMOS 208 consist of current source 15 in FIG. 3. The drain of PMOS 208 is connected to one end of resistor 211. The other end of 211 is connected to ground. The current in PMOS 208 is $I_{comp}$, which is compensation current. The source of PMOS 209 is connected to VDD and its gate is connected to the gate of PMOS 201. Therefore, PMOS 209 and PMOS 201 consist of another current source 14 in FIG. 3. Current 18 in PMOS 209 is proportional to $I_{bias}$ in PMOS 201. The drain of PMOS 209 is connected to the drain of NMOS 210.

The gate of PMOS 210 is connected to the drain of PMOS 202. NMOS 210's bulk is connected to ground and its source is connected to the drain of PMOS 208. Device 212 is an inverter, and its input is connected to the drain of NMOS 210. Inverter 212's output is connected to the input of inverter 213. Inverter 213's output is connected to the input of inverter 214. Inverter 214's output is connected to the gate of NMOS 204 to turn on and off NMOS 204. The source of NMOS 204 is connected to ground and its drain is connected to the drain of PMOS 202. The inverters 212, 213, and 214 consist of reset circuit 13 in FIG. 3.

Device 215 is an edge triggered flip flop register. It has 4 terminals: Clk, D, Q and $\overline{Q}$. 215's terminal Clk is connected to the output of Inverter 213 and its terminal $\overline{Q}$ is connected to its own terminal D. 215's terminal Q is this designed oscillator's output clock signal. Voltage at NMOS 204's drain is $V_1$, voltage at PMOS 209's drain is $V_2$, voltage at inverter 212's output is $V_3$, voltage at inverter 213's output is $V_4$ and voltage at inverter 214's output is $V_5$.

Figure 9:
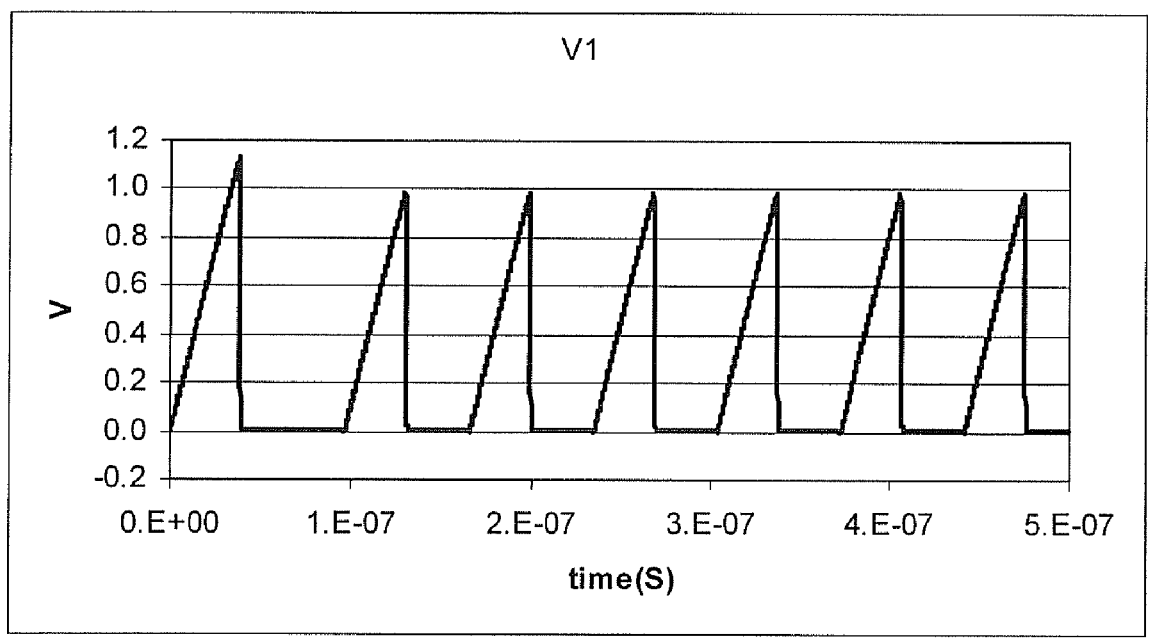
FIGS. 9 to 14 show waveforms that illustrate the operation of the circuit of FIG. 8.
Figure 10:
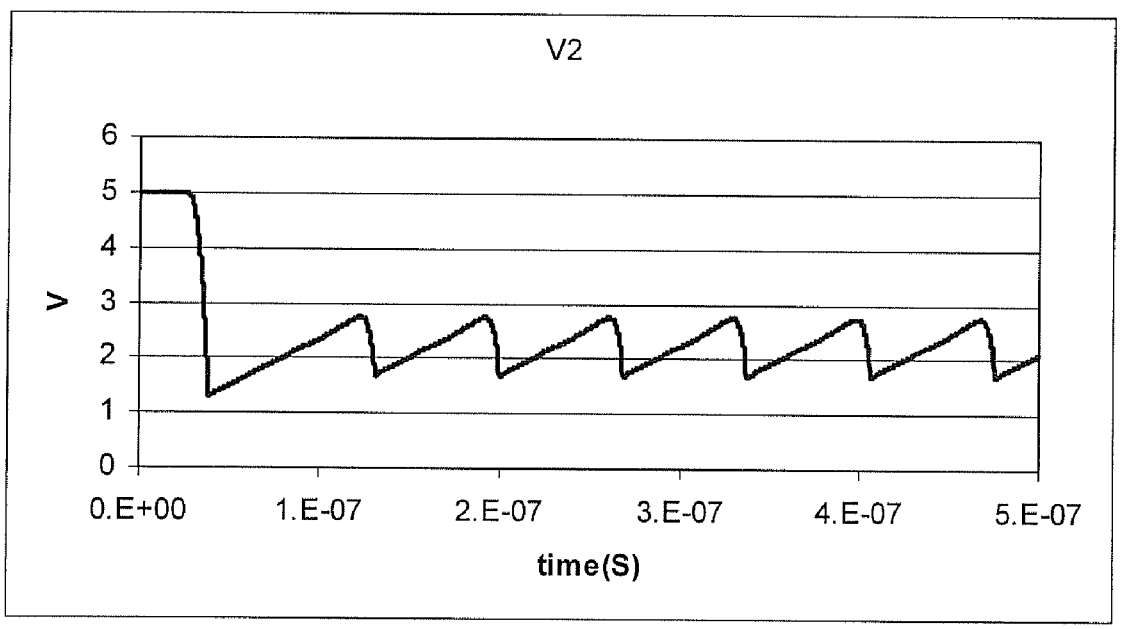
Figure 11:
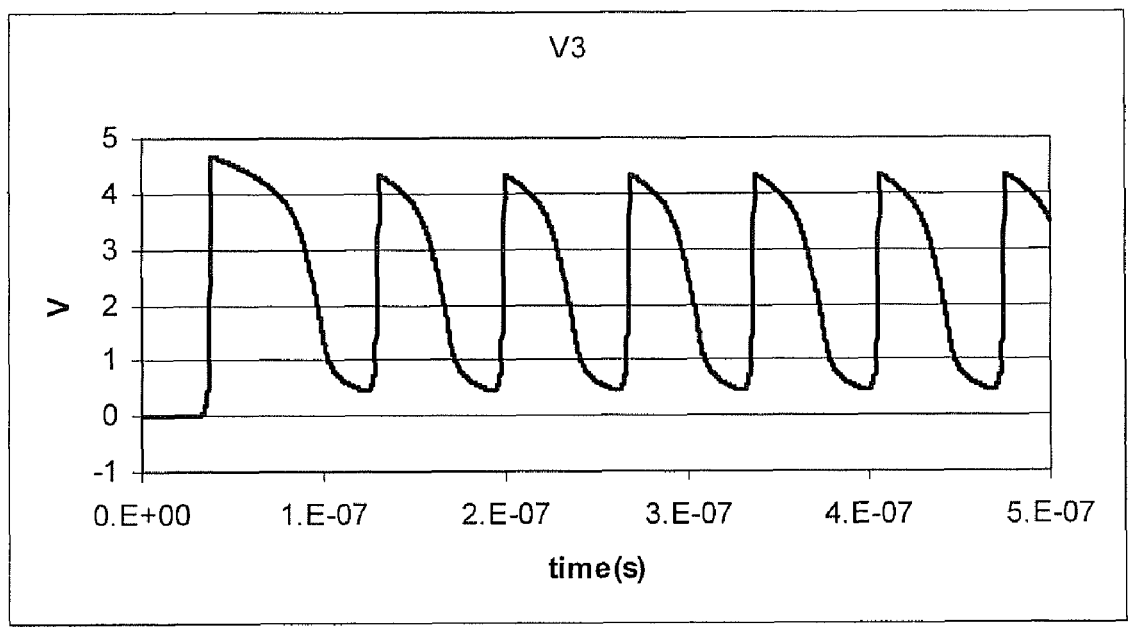
Figure 12:
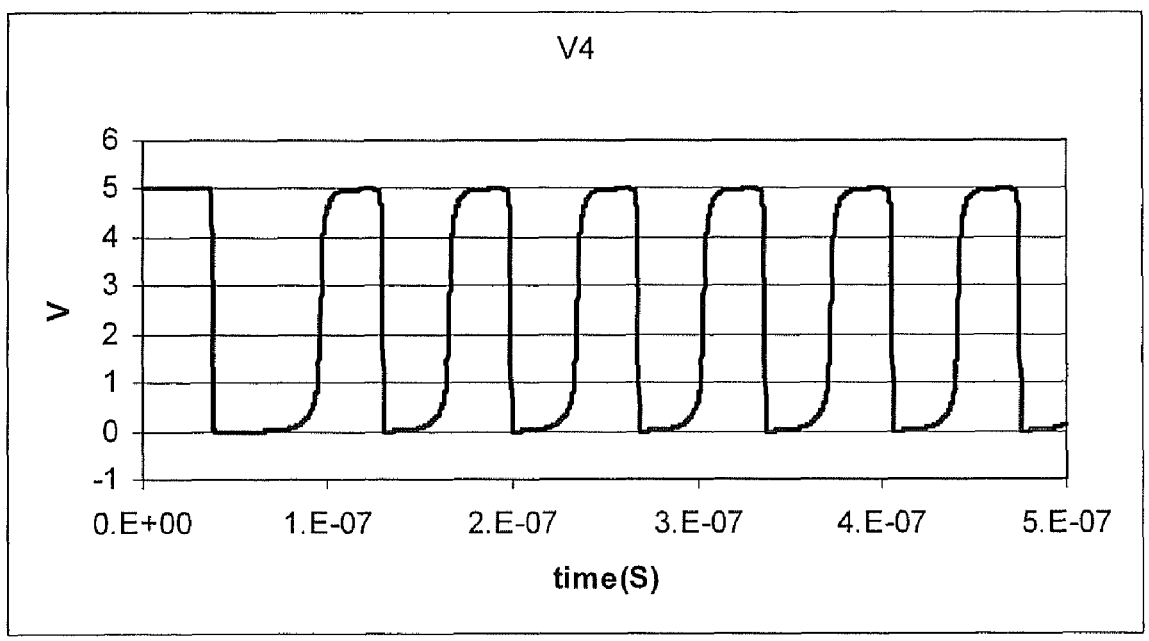
Figure 13:
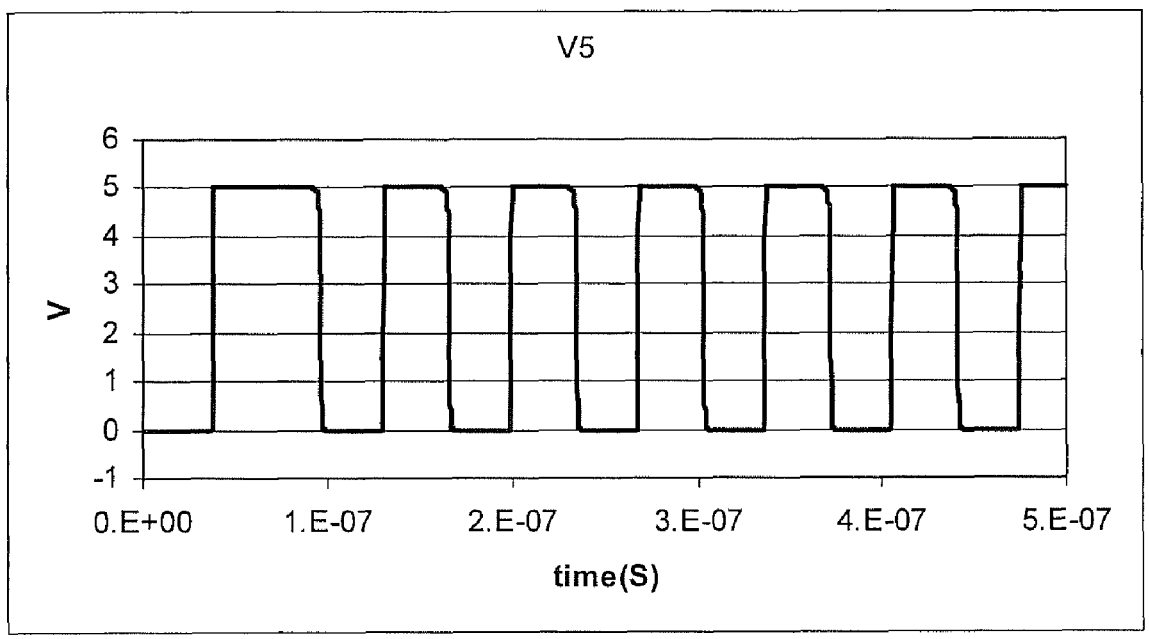
Figure 14:
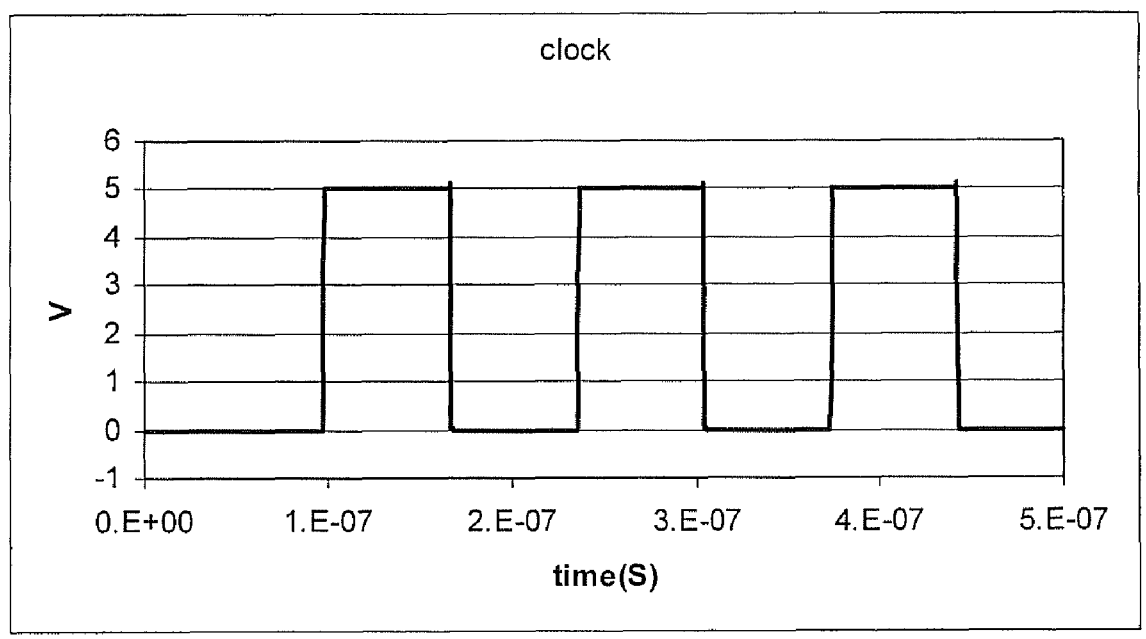

FIGS. 9-14 are waveforms that illustrate the operation of the circuit of FIG. 8. Assuming at time 0 second as shown in FIG. 9, there is no charge on the capacitor 203, $V_1$ is equal to 0V, and 210 is off and $V_2$ equals to VDD as shown in FIG. 10, inverter 212's output $V_3$ is logic low as shown in FIG. 11, Inverter 213's output $V_4$ is logic high as shown in FIG. 12, and inverter 214's output $V_5$ is logic low as shown in FIG. 13, which keeps NMOS 204 off. After this 0 second point, I1 starts charging capacitor 203, and voltage $V_1$ will rise linearly as shown in FIG. 9 because I1 is a constant bias current to the first order. When $V_1$ is increased to a certain point above the threshold voltage of NMOS 210, NMOS 210 is turned on and $V_2$ voltage starts decreasing as shown in FIG. 10.

Decreased $V_2$ changes inverter 212's output $V_3$ to logic high, inverter 213's output $V_4$ to logic low as shown in FIG. 12, and inverter 214's output to logic high. Inverter 214's logic high output will turn on NMOS 204 and therefore discharge capacitor 203. After discharging, the voltage $V_1$ becomes low, which turns off NMOS 210 again and voltage $V_2$ become equal to VDD. This change also makes the output of NMOS 214 become logic zero and turns off NMOS 204. When NMOS 204 is turned off, I1 starts charging capacitor 203 again. This process keeps repeating. The final oscillator clock can be taken from inverter 214's output $V_5$, or from register 215's output 'clock' signal.

Power Saving Circuit

The circuit in FIG. 8 involves in same environments some unnecessary power consumption. First, signal $V_2$ has a very slow rising and falling slope as shown in FIG. 10, which make inverter 212 spend more than necessary time in amplification mode, that means inverter 212 consume extra power, which is undesirable. Second, $V_3$ signal has a very slow falling slope, making inverter 213 consume a lot power. Thirdly, $V_5$ has a square waveform according to FIG. 13, and NMOS 204 is on when $V_5$ gives logic high. That means the bias current $I_1$ is directly injected into ground when $V_5$ is logic high, a waste of power.

For low power application, NMOS 210 should behave as close to a switch as possible, turned on and off. Also signal $V_5$ should have as low duty cycle as possible for low power consumption.

Figure 15:
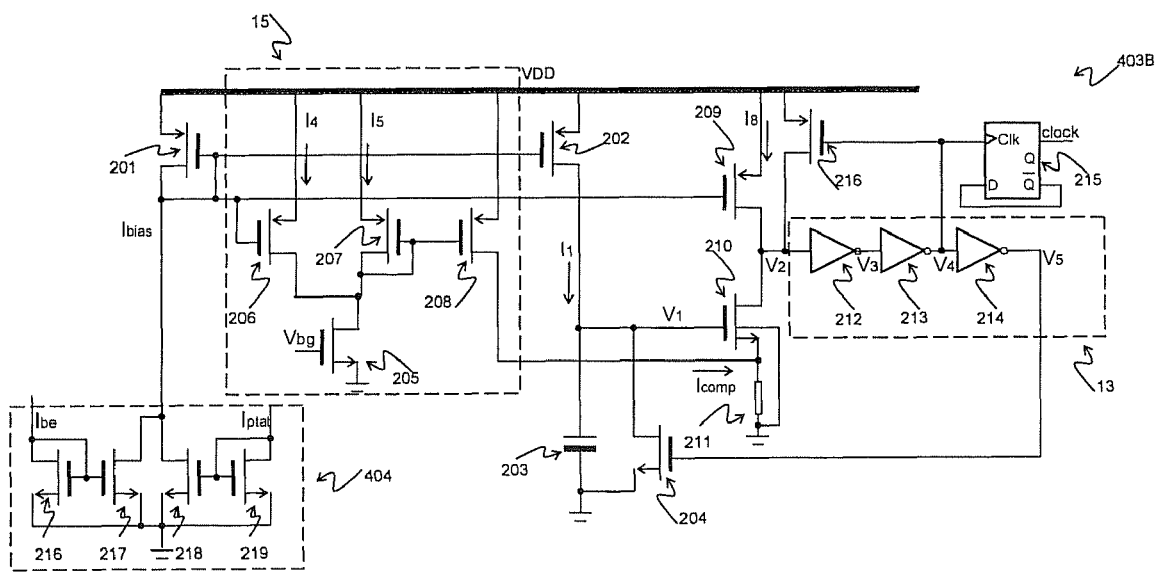
FIG. 15 is an oscillator circuit in accordance with the present invention that includes a power saving feature.
Figure 16:
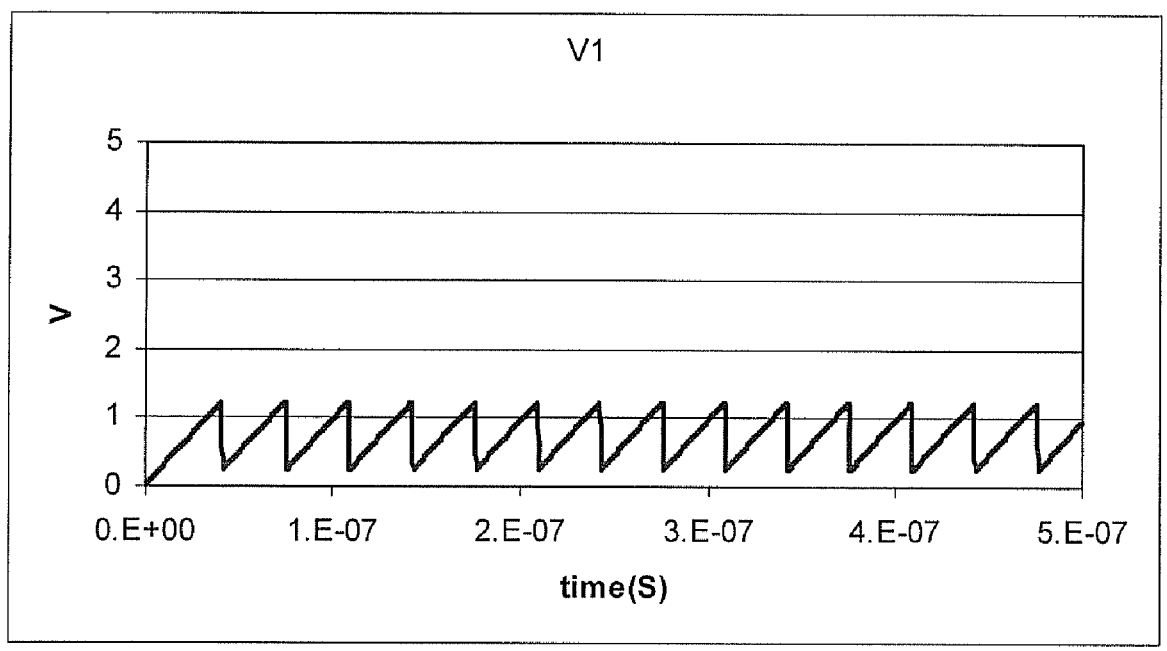
FIGS. 16 to 21 show waveforms that illustrate the operation of the circuit of FIG. 15.

FIG. 15 is an oscillator circuit in accordance with the present invention that includes a power saving feature. The circuit in FIG. 15 is the same as that in FIG. 8 except that there is one extra PMOS 216 introduced in FIG. 15. PMOS 216's gate is connected to the output of inverter 213, its source is connected VDD and the drain is connected to the drain of PMOS 209. NMOS 210 through inverter 212, 213 and PMOS 216 form a close loop.

When NMOS 210 starts turning on, the drain voltage of NMOS 210 is still close to VDD and NMOS 210 is in active region. However, when NMOS 210 starts turning on, $V_2$ and $V_4$ start decreasing, which makes PMOS 216 try to hold voltage at $V_2$ close to logic high for more time than if there is no PMOS 216 and gate inverter 212 sees logic high input instead of an analog input.

When NMOS 210 is finally turned on, PMOS 216 injects extra current into NMOS 210. By charging more dynamic current into NMOS 210, PMOS 216 reduces NMOS 210's turning on time with lower $I_{bias}$ current when compared with design having no PMOS 216. Reduced turning-on time for NMOS 210 also finally reduces duty cycle for signal $V_5$.

Figure 17:
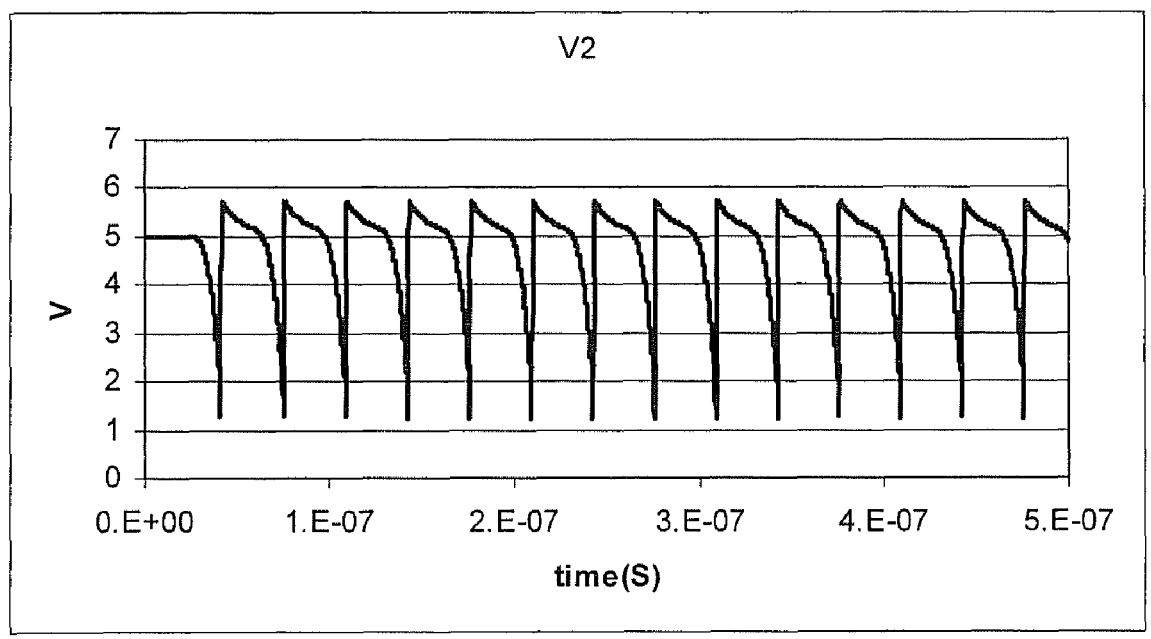
Figure 18:
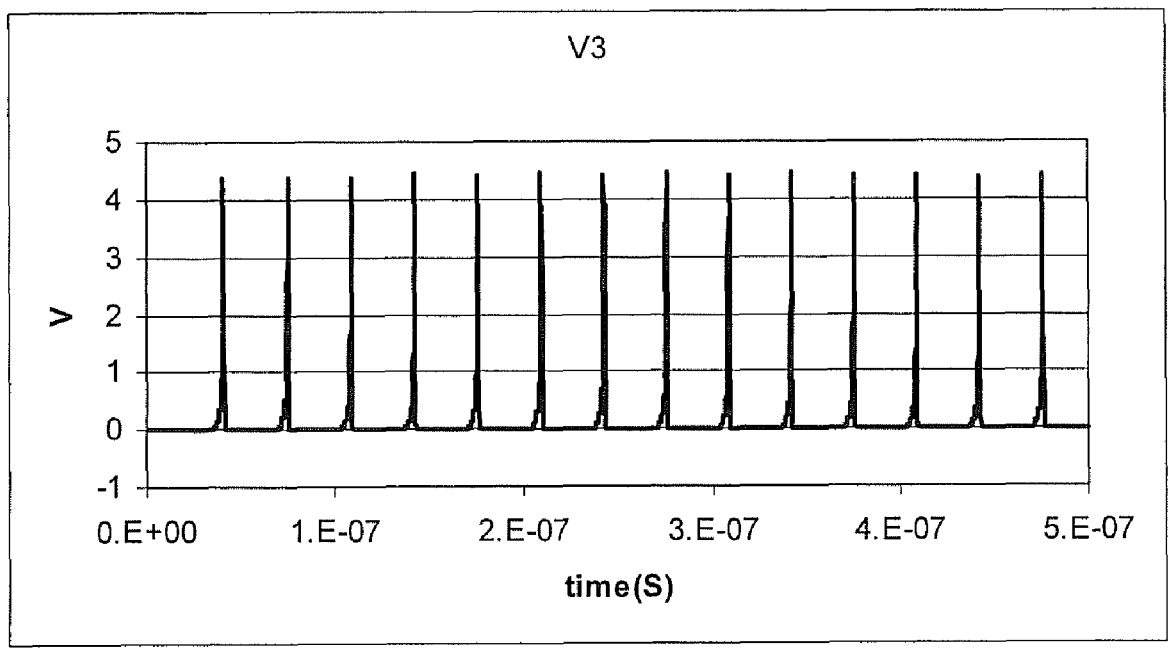
Figure 19:
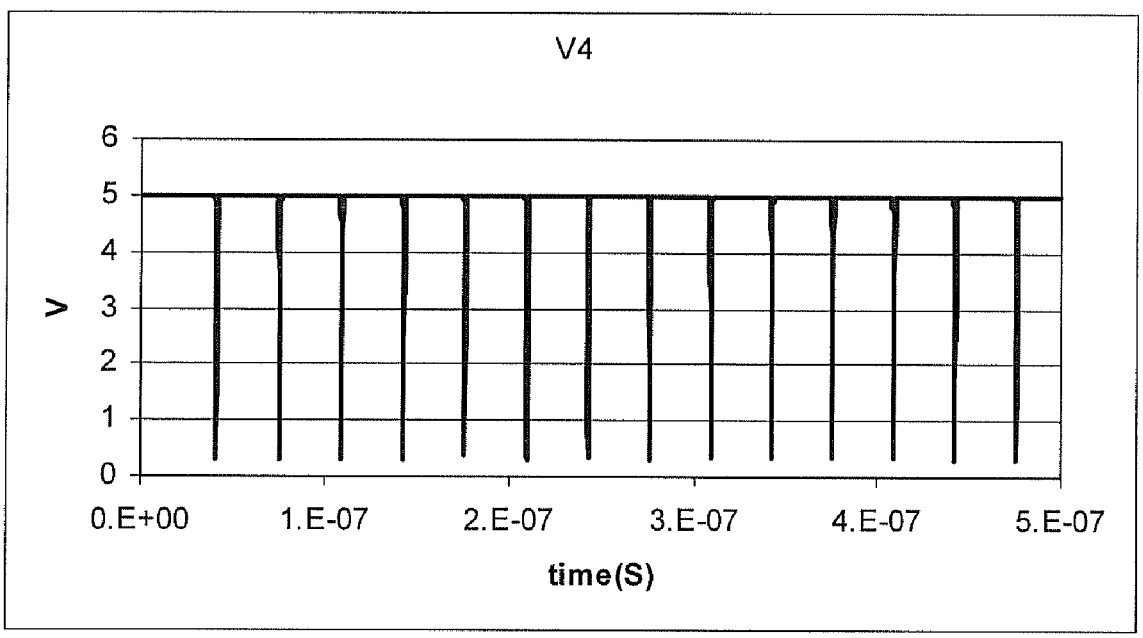
Figure 20:
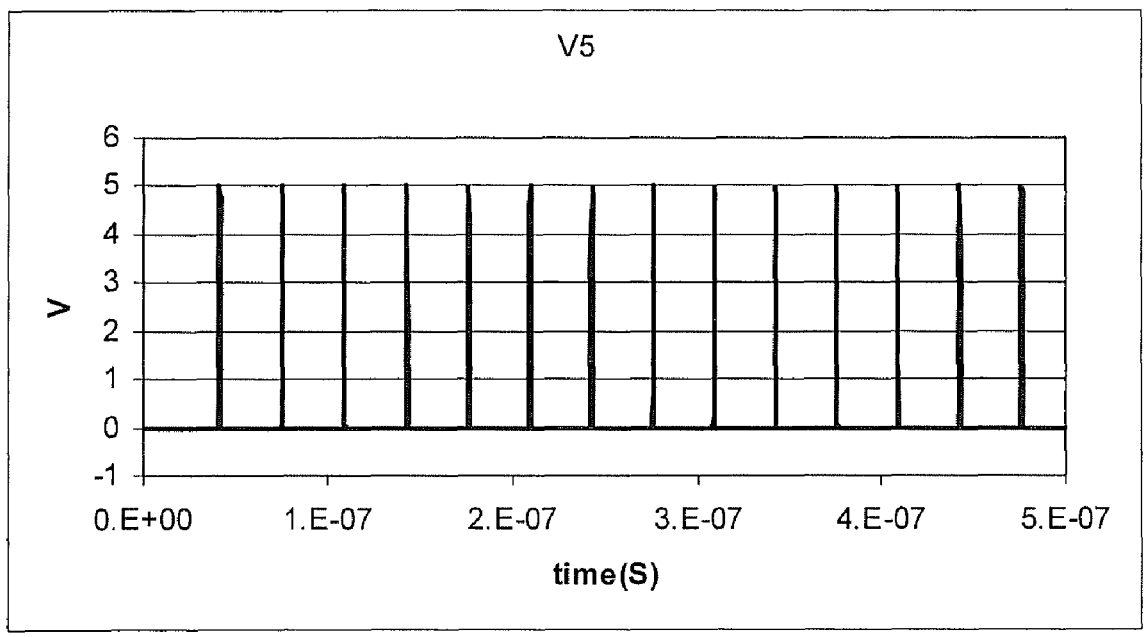
Figure 21:
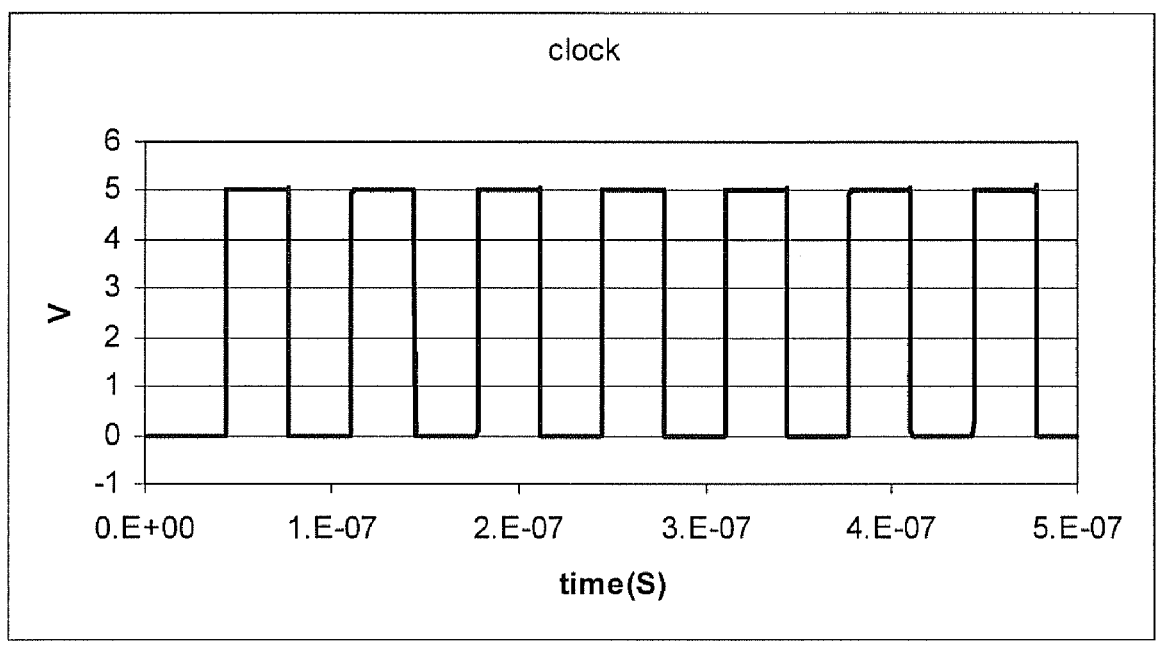

So, PMOS 216 has two functions here: the first function is to achieve an oscillator with higher frequency at lower power consumption; the second function is to make NMOS 210 behave more like a switch. PMOS 216 only consume small dynamic transient current. FIG. 16 to FIG. 21 show waveforms of $V_1, V_2, V_3, V_4, V_5$ and output clock signal generated by circuit in FIG. 15. It is clear that $V_2$ in FIG. 17 is more like a square waveform than that in FIG. 10, which verifies that PMOS 216 makes NMOS 210 behave more like a switch. Also for low power, the size of NMOS 204 is large enough to make the discharging time constant negligible when compared with capacitor 203's charging time.

Figure 22:
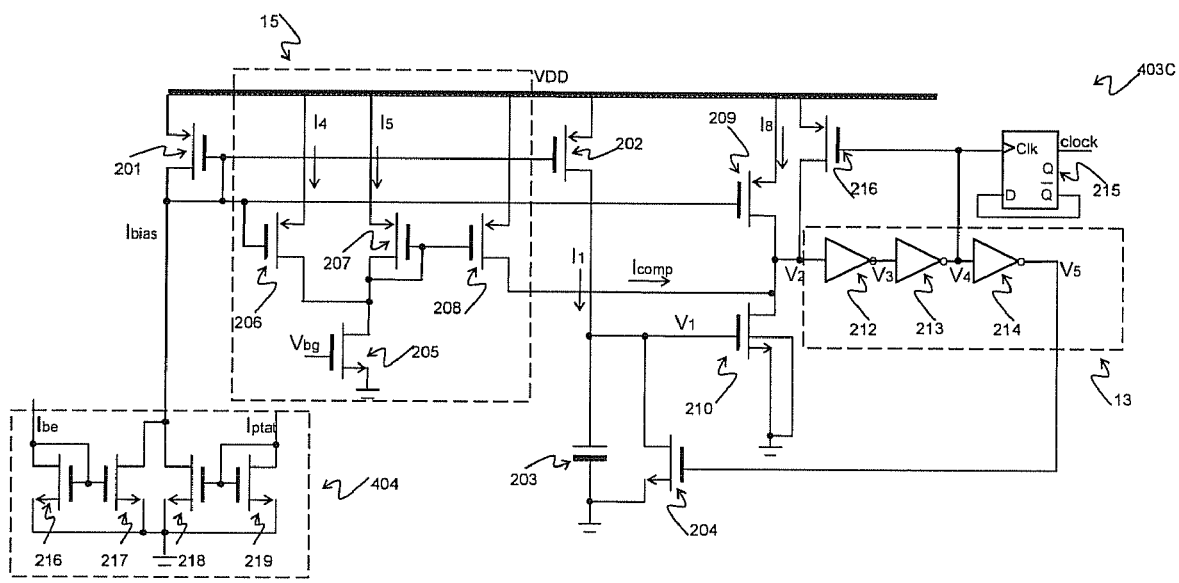
FIG. 22 is one alternative embodiment of a circuit in accordance with the present invention.
Figure 23:
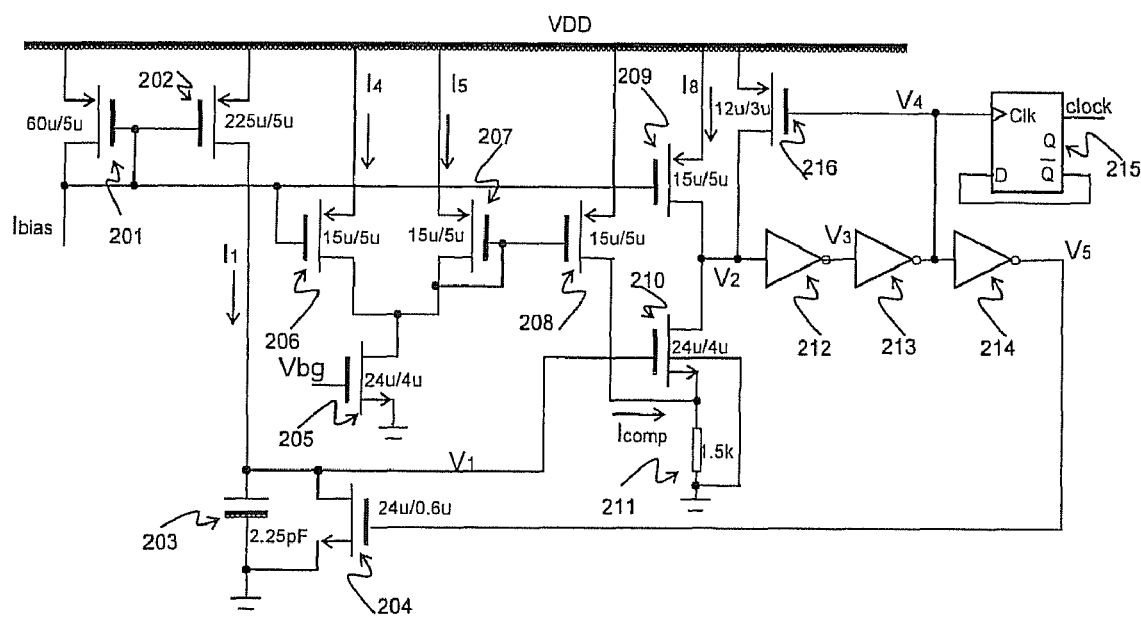
FIG. 23 is the circuit of FIG. 15 with optimum sizes.

FIG. 22 shows one alternative way of implementation. In this figure, there is no resistor 211, and the source of 210 is directly connected to ground. The drain of 208 and 210 are connected together. Therefore the compensation current is directly injected into the drain of 210. FIG. 23 shows the optimum implementation of current invention.

Figure 24:
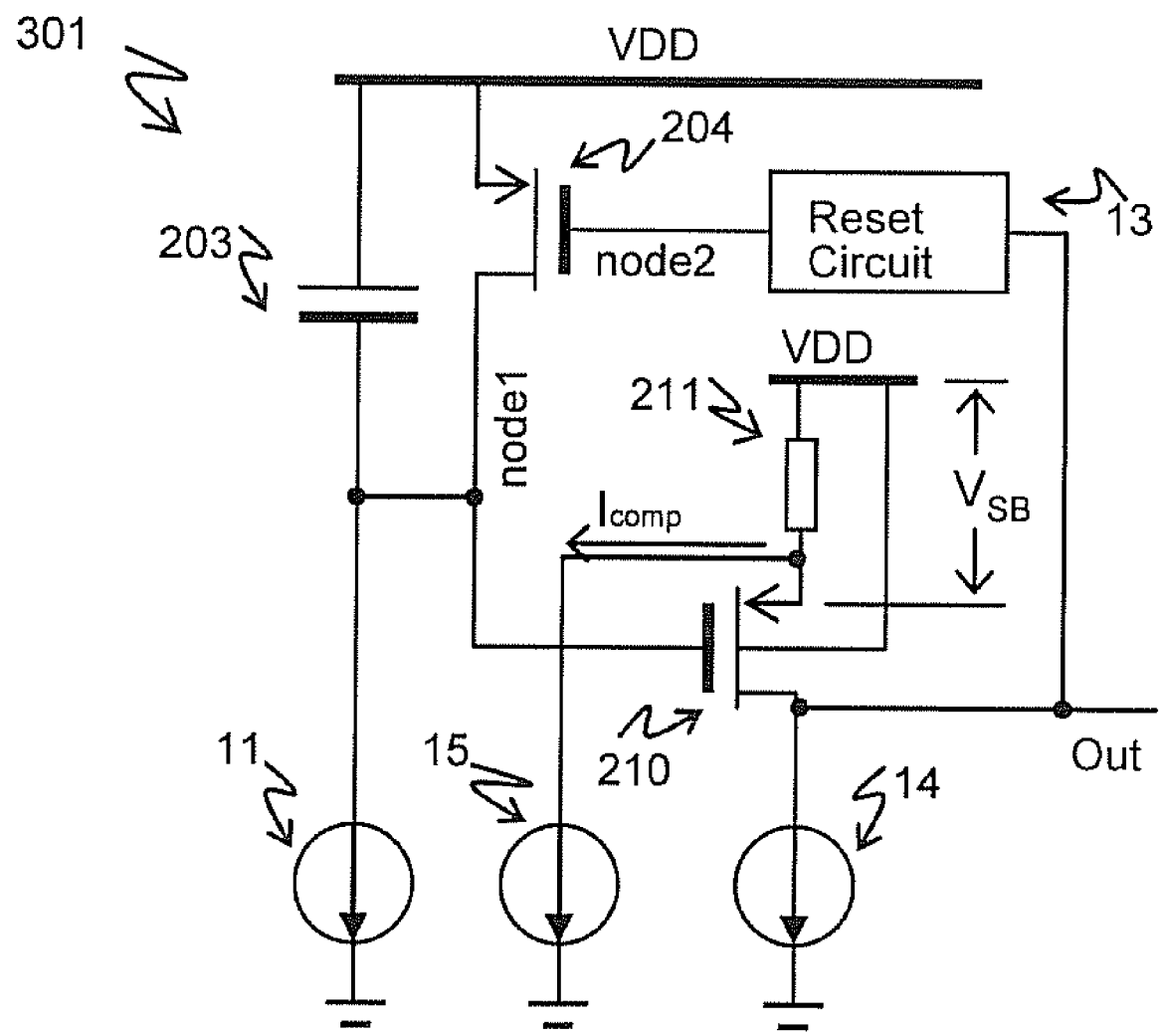
FIG. 24 shows another way of changing source-bulk voltage by inserting a resistor between source and bulk of PMOS while PMOS's bulk is directly connected to VDD.

In FIG. 23, the device 204 and 210 are both implemented by NMOS transistors. They can also be implemented by N-type Junction-Gate-Field-Effect-Transistors (JFET), P-type JFET, or PMOS transistors. FIG. 24 shows the PMOS implementation of both device 204 and 210. In FIG. 24, the source of PMOS 204 is connected to VDD and its drain is connected to the bottom plate of capacitor 203. One end of resistor 211 is connected to VDD and the other end of this resistor is connected the source of PMOS 210. The drain of PMOS 210 is connected to current source 14. One end of the compensation current source 15 is connected to the source of PMOS 210, while the other end of current source 15 is connected to ground.

Figure 25:
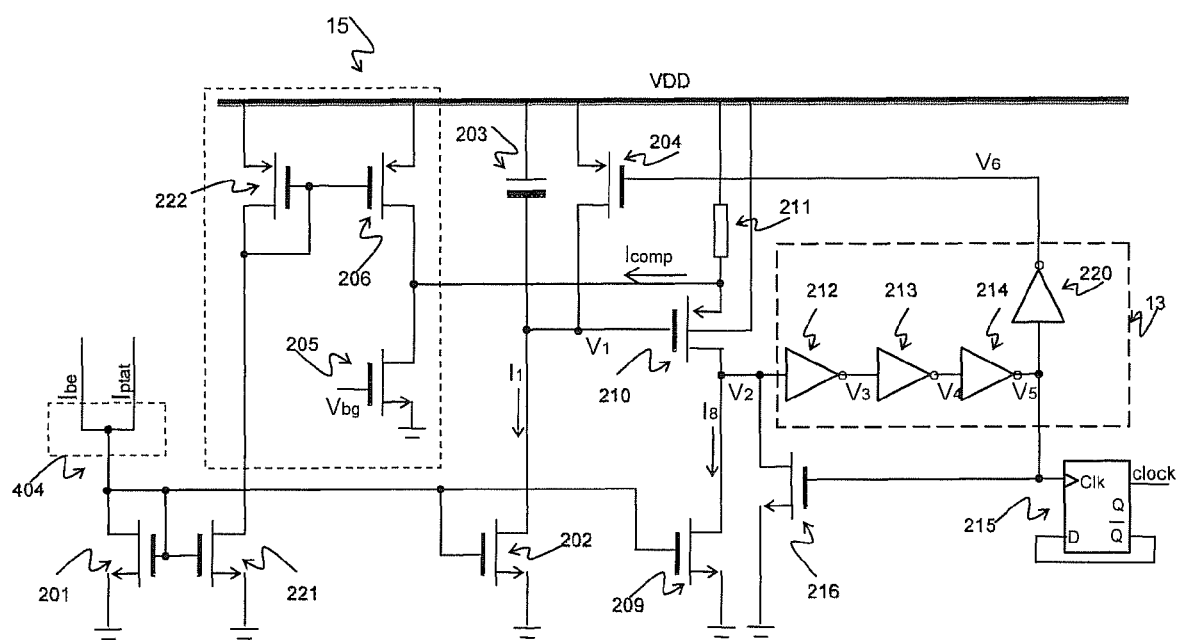
FIG. 25 shows one embodiment of FIG. 24 in accordance with the present invention.

FIG. 25 shows the detailed implementation of FIG. 24. The PMOS 201 in FIG. 15 is NMOS in FIG. 25. The device 207 and 208 in FIG. 15 are removed in FIG. 25. And the compensation current is directly generated from the source of NMOS 205. The summation node 404 in FIG. 15 is implemented by directly connecting $I_{be}$ and $I_{ptat}$ current together. The current in NMOS 201 and 221 are $I_{bias}$ current constant over the temperature to the first order. Besides 204 and 210 are PMOS, 216 are also PMOS. There is one more inverter 220 to keep the desired logic. When temperature increases, the threshold voltage of NMOS 205 is reduced. That means the over-driven voltage of NMOS 205 is increased, which results into an increased drain current in NMOS 205. The current in 206 is constant. So, the increased current in NMOS 205 comes from resistor 211 as compensation current. Increased current in resistor 211 increases the source-bulk voltage of $V_{SB}$ for PMOS 210 to stabilize the threshold voltage of PMOS 210.

Although the present invention has been described in accordance with the embodiments shown, one having ordinary skill in the art will readily recognize that there could be variations to the embodiments and those variations would be within the spirit and scope of the present invention. Additionally, many modifications may be made by one having ordinary skill in the art without departing from the spirit and scope of the appended claims.

What is claimed is:

1. An oscillator circuit comprising:
   a first current source; and
   a comparing circuit coupled to the first current source; the comparing circuit comprising an NMOS device and second current source coupled to the NMOS device; and resistance coupled between the source and the bulk of the NMOS device, the bulk of the NMOS device is coupled to ground, wherein the second current source injects compensation current into the resistance, wherein the second current source generates a compensation current with a positive temperature coefficient.

2. The oscillator circuit of claim 1, wherein the second current source is generated based on a reference bias current, which is constant over temperature to the first order and a reference voltage is generated that is also constant over temperature to the first order.

3. The oscillator circuit of claim 2, wherein the reference voltage is provided by a bandgap circuit and wherein the reference bias current is provided by a summation of the PTAT current with a positive temperature coefficient and a $I_{be}$ current with a negative temperature coefficient.

4. The oscillator circuit of claim 1, further comprises:
   a reset circuit coupled to an output; and
   a second NMOS device coupled to the first NMOS device and the reset circuit, wherein the reset circuit controls the second NMOS device.

5. The oscillator circuit of claim 1 which includes a PMOS device coupled to the NMOS device; and an inverter, wherein the PMOS device, NMOS device and the inverter form a closed loop, wherein the PMOS device allows the oscillator circuit to operate at a higher frequency with lower power consumption and the PMOS device causes the NMOS device to behave more like a switch.

6. An oscillator circuit comprising:
a first current source; and
a comparing circuit coupled to the first current source; the comparing circuit comprising an NMOS device and second current source coupled to the NMOS device; and resistance coupled between the source and the bulk of the NMOS device, the bulk of the NMOS device is coupled to ground, wherein the second current source injects compensation current into the resistance, wherein the second current source is generated based on a reference bias current, which is constant over temperature to the first order and a reference voltage is generated that is also constant over temperature to the first order.

7. An oscillator circuit comprising:
a first current source; and
a comparing circuit coupled to the first current source; the comparing circuit comprising an NMOS device and second current source coupled to the NMOS device; and resistance coupled between the source and the bulk of the NMOS device, the bulk of the NMOS device is coupled to ground, wherein the second current source injects compensation current into the resistance, which includes a PMOS device coupled to the NMOS device; and an inverter, wherein the PMOS device, NMOS device and the inverter form a closed loop, wherein the PMOS device allows the oscillator circuit to operate at a higher frequency with lower power consumption and the PMOS device causes the NMOS device to behave more like a switch.

* * * * *